(12) United States Patent
Cheng et al.

(10) Patent No.: US 12,015,025 B2
(45) Date of Patent: Jun. 18, 2024

(54) TRANSIENT VOLTAGE SUPPRESSION DEVICE AND MANUFACTURING METHOD THEREFOR

(71) Applicant: CSMC TECHNOLOGIES FAB2 CO., LTD., Wuxi (CN)

(72) Inventors: Shikang Cheng, Wuxi (CN); Yan Gu, Wuxi (CN); Sen Zhang, Wuxi (CN)

(73) Assignee: CSMC TECHNOLOGIES FAB2 CO., LTD., Jiangsu (CN)

( * ) Notice: Subject to any disclaimer, the term of this patent is extended or adjusted under 35 U.S.C. 154(b) by 336 days.

(21) Appl. No.: 17/265,549

(22) PCT Filed: Aug. 15, 2019

(86) PCT No.: PCT/CN2019/100690
§ 371 (c)(1),
(2) Date: Feb. 3, 2021

(87) PCT Pub. No.: WO2020/042914
PCT Pub. Date: Mar. 5, 2020

(65) Prior Publication Data
US 2023/0122120 A1  Apr. 20, 2023

(30) Foreign Application Priority Data

Aug. 31, 2018 (CN) .......................... 201811015332.1

(51) Int. Cl.
| H01L 27/02 | (2006.01) |
| H01L 29/06 | (2006.01) |
| H01L 29/66 | (2006.01) |
| H01L 29/866 | (2006.01) |

(52) U.S. Cl.
CPC ...... *H01L 27/0255* (2013.01); *H01L 29/0692* (2013.01); *H01L 29/66106* (2013.01); *H01L 29/866* (2013.01)

(58) Field of Classification Search
CPC ............. H01L 27/0255; H01L 27/0262; H01L 27/0266; H01L 27/04; H01L 27/0641;
(Continued)

(56) References Cited

U.S. PATENT DOCUMENTS 6,822,295 B2   11/2004 Larson
8,218,276 B2   7/2012  Mallikarjunaswamy
(Continued)

FOREIGN PATENT DOCUMENTS

CN    102437156      5/2012
CN    102856323 A    1/2013
(Continued)

OTHER PUBLICATIONS

Dong et al., Electrostatic Discharge Protection Device for Radio Frequency Integrated circuit, Mar. 20, 2013, machine translation of CN 102244076, pp. 1-3. (Year: 2013).*
(Continued)

*Primary Examiner* — Natalia A Gondarenko
(74) *Attorney, Agent, or Firm* — Dority & Manning, P.A.

(57) ABSTRACT

A transient voltage suppression device includes: a substrate; a first conductive type well region including a first well and a second well; a second conductive type well region including a third well and a fourth well, the third well being disposed between the first well and the second well so as to isolate the first well and the second well, and the second well being disposed between the third well and the fourth well; a zener diode active region; a first doped region, provided in the first well; a second doped region, provided in the first well; a third doped region, provided in the second well; a fourth doped region, provided in the second well; a fifth doped region, provided in the zener diode active region; and a sixth doped region, provided in the zener diode active region.

15 Claims, 3 Drawing Sheets

(58) Field of Classification Search
CPC ............. H01L 27/0814; H01L 27/0928; H01L 27/1028; H01L 29/0692; H01L 29/66106; H01L 29/66113; H01L 29/866; H01L 29/8611; H01L 29/7851; H01L 29/7808; H01L 29/7821; H01L 29/7845; H01L 29/7436; H01L 29/7412; H01L 29/41716; H01L 29/40; H01L 29/36; H01L 29/417; H01L 29/404; H01L 29/407; H01L 29/868; H01L 29/861; H01L 29/872; H01L 29/8725; H01L 29/0649; H01L 29/0688; H01L 29/6606; H01L 29/66068; H01L 29/66098; H01L 29/882; H01L 29/885; H01L 2027/11833; H01L 2027/11866; H01L 2027/11861; H01L 21/784; H01L 21/76859; H01L 21/74–746; H01L 21/762; H01L 21/76213; H01L 29/66121; H01L 29/66136; H01L 29/66143; H01L 29/66151; H01L 29/66219; H01L 29/66363; H01L 29/66371; H01L 29/66386; H01L 29/66393; H01L 29/66413; H01L 29/66212; H01L 29/7811; H01L 27/0248; H01L 27/0292; H01L 27/0296; H01L 27/0811; H01L 27/0817; H01L 27/1463
USPC ....... 257/146, 173, 603, 619, 620, 623, 622, 257/625, 618, 332, 355, 328
See application file for complete search history.

(56) References Cited

U.S. PATENT DOCUMENTS

| | | | |
|---|---|---|---|
| 8,503,141 B2 | 8/2013 | Mallikarjunaswamy | |
| 8,723,264 B2 | 5/2014 | Marreiro et al. | |
| 9,633,989 B2 | 4/2017 | Kato et al. | |
| 9,741,708 B2* | 8/2017 | Hung | ................. H01L 29/8611 |
| 10,263,417 B2 | 4/2019 | Chen | |
| 2002/0171110 A1* | 11/2002 | Tang | ................. H01L 27/0255 438/983 |
| 2005/0280091 A1* | 12/2005 | Huang | ................. H01L 29/0619 257/362 |
| 2011/0163352 A1* | 7/2011 | Gee | ................. H01L 23/60 257/E23.141 |
| 2012/0068299 A1 | 3/2012 | Lin et al. | |
| 2017/0221875 A1* | 8/2017 | Chen | ................. H01L 27/0814 |
| 2019/0371785 A1* | 12/2019 | Liu | ................. H01L 23/60 |

FOREIGN PATENT DOCUMENTS

| | | | | | |
|---|---|---|---|---|---|
| CN | 102244076 B | * | 3/2013 | ............. | H01L 27/04 |
| CN | 103779349 | | 5/2014 | | |
| CN | 104022162 A | * | 9/2014 | .......... | H01L 21/265 |
| CN | 104347621 A | | 2/2015 | | |
| CN | 104392989 A | | 3/2015 | | |
| CN | 205039152 | | 2/2016 | | |
| TW | 201240063 | | 10/2012 | | |

OTHER PUBLICATIONS

Duan et al., BCD Technology in Isolation Type Lateral Zener Diode and Manufacturing Method Thereof, 2014, machine translation of CN 104022162 A, pp. 1-5. (Year: 2014).*
PCT International Search Report for corresponding PCT Application No. PCT/CN2019/100690, dated Nov. 20, 2019, 5 pages.
Japanese Office Action for corresponding CN Application No. 201811015332.1, dated Oct. 20, 2021, 9 pages.
Supplementary European Search Report for corresponding European Application No. EP 19 85 5237, dated Apr. 29, 2022, 2 pages.

* cited by examiner

TRANSIENT VOLTAGE SUPPRESSION DEVICE AND MANUFACTURING METHOD THEREFOR

CROSS-REFERENCE TO RELATED APPLICATIONS

This application is a National Stage of International Application No. PCT/CN2019/100690, filed on Aug. 15, 2019, which claims priority to Chinese Patent Application No. 201811015332.1, filed on Aug. 31, 2018, both of which are hereby incorporated by reference in their entireties.

TECHNICAL FIELD

The present disclosure relates to the field of semiconductor manufacturing, particularly to a transient-voltage suppression device, and to a method for manufacturing a transient-voltage suppression device.

BACKGROUND

Unexpected voltage transients and surges are often encountered in the whole machine and system, causing burnout and breakdown of semiconductor devices in the whole machine and system, thereby resulting in damage to the whole machine and system. Therefore, transient voltage suppressors (TVS), as a highly effective protection device with PN-junction, are widely used for various I/O interfaces due to their fast response and high resistance against the ESD. Currently, the transmission speed of high-speed interfaces, represented by high-definition multimedia interfaces (HDMI), becomes faster and faster, even up to 5 Gbps. In order to ensure the completeness of data, the requirements for capacitors against ESD arranged at interfaces are extremely strict. In addition, the number of pins in a physical drive chip is up to hundreds. Each of the pins is threated by the ESD. In order to protect the I/O interfaces as many as possible without taking up too large area, the requirements for the integration of TVS becomes higher.

SUMMARY

In view of above, it is necessary to provide a transient-voltage suppression device having a new structure, and a method for manufacturing the same.

A transient-voltage suppression device is provided, which includes a substrate of a second conductivity type; a first-conductivity-type well region disposed in the substrate and including a first well and a second well; a second-conductivity-type well region disposed in the substrate and including a third well and a fourth well, the third well being disposed between the first well and the second well to isolate the first well and the second well from each other, and the second well being disposed between the third well and the fourth well; the first conductivity type and the second conductivity type being conductivity types opposite to each other; a zener diode active region disposed in a fourth well and being of the second conductivity type; a first doped region being of a first conductivity type and disposed in the first well; a second doped region being of the second conductivity type and disposed in the first well; a third doped region being of the first conductivity type and disposed in the second well; a fourth doped region being of the second conductivity type and disposed in the second well; a fifth doped region being of the first conductivity type and disposed in the zener diode active region; a sixth doped region being of the second conductivity type and disposed in the zener diode active region; wherein the fourth doped region is used as an anode region of a first diode, the first doped region is used as a cathode region of a second diode, and an electrical connection between the first doped region and the fourth doped region is used as a first potential terminal; the third doped region is used as a cathode region of the first diode, the fifth doped region is used as a cathode region of a zener diode, and an electrical connection between the third doped region and the fifth doped region is used as a second potential terminal; and the second doped region is used as an anode region of the second diode, the sixth doped region is used as an anode region of the zener diode, and an electrical connection between the second doped region and the sixth doped region is used as a third potential terminal.

A method for manufacturing a transient-voltage suppression device is provided. The transient-voltage suppression device includes a first diode, a second diode, and a zener diode. An electrical connection between an anode of the first diode and a cathode of the second diode is used as a first potential terminal. An electrical connection between a cathode of the first diode and a cathode of the zener diode is used as a second potential terminal. An electrical connection between an anode of the second diode and an anode of the zener diode is used as a third potential terminal. The method includes: forming a mask layer on a substrate of a second conductivity type, and then, performing lithography and etching the mask layer to expose a doping window of a first-conductivity-type well region; doping the substrate with first-conductivity-type ions through the doping window of the first-conductivity-type well region to form a first region on a surface of the substrate; growing an oxide layer as a doping blocking-layer in the first region; removing the mask layer, and doping areas of the surface of the substrate not covered by the doping blocking-layer with second-conductivity-type ions to form a second region; the first conductivity type and the second conductivity type being conductivity types opposite to each other; performing a thermal drive-in to enable the first region to diffuse to form a first well and a second well, and enable the second region to diffuse to form a third well and a fourth well, the third well is located between the first well and the second well to isolate the first well and the second well from each other, and the second well is located between the third well and the fourth well; forming, after the doping blocking-layer is removed, respectively a first doped region, a second doped region, a third doped region, a fourth doped region, a fifth doped region, a sixth doped region, and a zener diode active region by lithographing and doping; wherein the zener diode active region is located in the fourth well and is of the second conductivity type; the first doped region is of the first conductivity type and located in the first well; the second doped region is of the second conductivity type and is disposed in the first well; the third doped region is of the first conductivity type and is disposed in the second well; the fourth doped region is of the second conductivity type and is disposed in the second well; the fifth doped region is of the first conductivity type and is disposed in the zener diode active region; and the sixth doped region is of the second conductivity type and is disposed in the zener diode active region.

One or more embodiments of the present disclosure will be described in detail in the following figures and description. Other features, objects and advantages of this application will become more apparent from the description, drawings and claims.

BRIEF DESCRIPTION OF THE DRAWINGS

In order to better describe and illustrate the embodiments and/or examples of the inventions disclosed herein, one or more figures can be referred to. The additional details or examples for illustrating the drawings should not be deemed as limiting the scope of any of the disclosed inventions, the currently described embodiments and/or examples, and the best mode of the inventions currently understood.

DETAILED DESCRIPTION OF THE EMBODIMENTS

The semiconductor terms used herein are the technical terms commonly used by those skilled in the art. For example, for P-type impurities and N-type impurities, it is simply to use P+-type to represent P-type with heavily doping concentration, P-type to represent P-type with medium doping concentration, P--type to represent P-type with lightly doping concentration, N+-type to represent N-type with heavily doping concentration, N-type to represent N-type with medium doping concentration, and N--type to represent N-type with lightly doping concentration.

Figure 1:
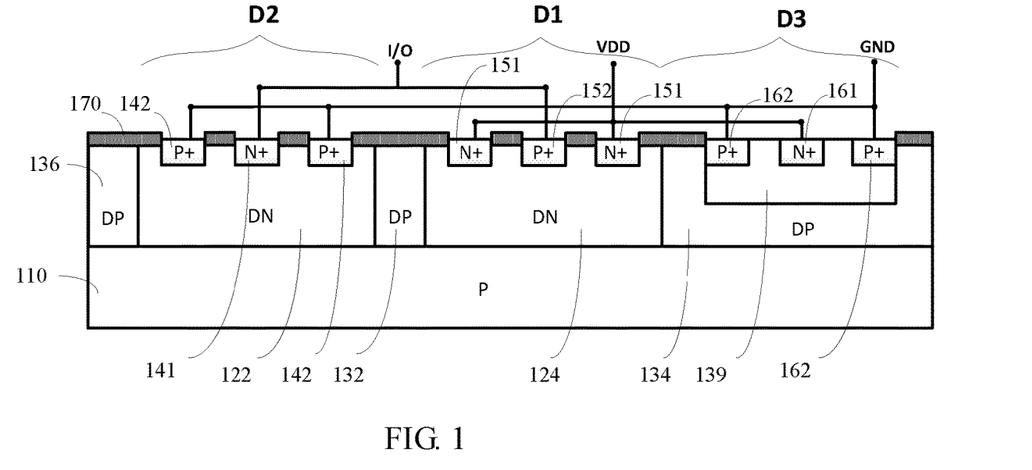
FIG. 1 is a schematic diagram of a structure of a transient-voltage suppression device according to an embodiment.

A conventional TVS consistent of a single avalanche diode has a comparably large capacitance, which is generally at least dozens of picofarads. The capacitance value increases proportionally as the increase of the capability of the ESD. A high capacitance value for high-speed interfaces will critically affect the integrity of data. The solution is generally to connect a diode having a low capacitance with the avalanche diode of the TVS in series to realize a one-way TVS having a low capacitance. As exemplary TVS devices, in one of them, the diode having the low capacitance and the avalanche diode of the TVS are integrated on the same chip by means of being implanted into a buried layer and growing epitaxy of high resistivity, which is, however, costly. In another one, the diodes are distributed on the surface of the chip using the conventional CMOS process. FIG. 1 is a schematic diagram illustrating a structure of a transient-voltage suppression device according to an embodiment. The transient-voltage suppression device includes a substrate region 110, a first-conductivity-type well region, a second-conductivity-type well region, a zener diode active region 139, a first doped region 141, a second doped region 142, a third doped region 151, a fourth doped region 152, a fifth doped region 161, and a sixth doped region 162. The first-conductivity-type well region includes a first well 122 and a second well 124, and the second-conductivity-type well region includes a third well 132 and a fourth well 134.

The substrate 110 is of a second conductivity type. The first-conductivity-type well region and the second-conductivity-type well region are disposed in the substrate 110. The zener diode active region 139 is disposed in the fourth well 134, and is of the second conductivity type. The first doped region 141 is of the first conductivity type, and is disposed in the first well 122. The second doped region 142 is of the second conductivity type, and is disposed in the first well 122. The third doped region 151 is of the first conductivity type, and is disposed in the second well 124. The fourth doped region 152 is of the second conductivity type, and is disposed in the second well 124. The fifth doped region 161 is of the first conductivity type, and is disposed in the zener diode active region 139. The sixth doped region 162 is of the second conductivity type, and is disposed in the zener diode active region 139. In the embodiment shown in FIG. 1, the first conductivity type is N-type, the second conductivity type is P-type, the substrate 110 is a P-type substrate, a first-conductivity-type well region is an N-well, and the second-conductivity-type well region is a P-well. In other embodiments, it is also possible that the first conductivity type is P-type, and the second conductivity type is N-type.

Figure 2:
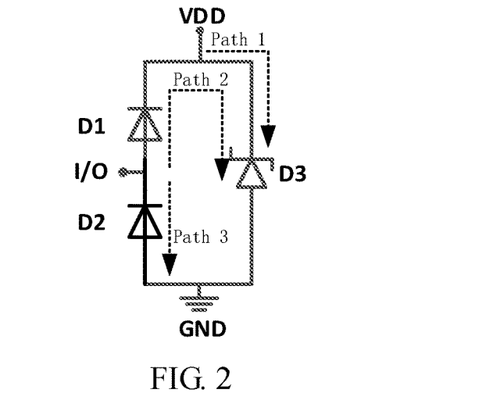
FIG. 2 is a schematic diagram of an equivalent circuit to the transient-voltage suppression device of FIG. 1.

FIG. 1 also shows electrically connecting each of the doped regions through metal interconnecting-wires, as an equivalent connection of the transient-voltage suppression device (a dot at the intersection of the wires means presence of a connection, no dot means absence of a connection). The fourth doped region 152 serves as an anode region of a first diode D1. The first doped region 141 serves as a cathode region of a second diode D2. An electrical connection of the first doped region 141 and the fourth doped region 152 serves as a first potential terminal, which is adapted to be electrically connected to an input/output terminal (I/O terminal). The third doped region 151 serves as a cathode region of the first diode D1. The fifth doped region 161 serves as a cathode region of a zener diode D3. An electrical connection between the third doped region 151 and the fifth doped region 161 serves as a second potential terminal, which is adapted to be electrically connected to a working-voltage terminal (VDD terminal). The second doped region 142 serves as an anode region of the second diode D2. The sixth doped region 162 serves as an anode region of the zener diode D3. An electrical connection between the second doped region 142 and the sixth doped region 162 serves as a third potential terminal, which is adapted to be connected to the ground (GND). FIG. 2 is a schematic diagram illustrating an equivalent circuit to the transient-voltage suppression device of FIG. 1.

In the above-mentioned transient-voltage suppression device, the isolation of the first well 122 from the second well 128 by the third well 132 (that is, each of the doped regions in the first well 122 is isolated from each of the doped regions in the second well 124) is equivalent to the isolation of the first diode D1 from the second diode D2, which has a good isolation effect, thereby avoiding the switch-on of a parasitic BJT. Therefore, the ESD has a strong robustness and is easily to be integrated.

Referring to FIG. 2, the above-mentioned transient-voltage suppression device can realize a protection on a path (path 1) from the working-voltage terminal VDD to the ground GND, and a protection on paths (path 2 and path 3) from the input/output terminal I/O to the ground GND. When a positive instant impulse signal is input through the input/output terminal I/O, since the first diode D1 is forwardly biased and the second diode D2 is reversely biased, the signal flows through the first diode D1 first, then through the zener diode D3, and lastly flows to the ground GND. The voltage of the input/output terminal I/O is clamped at $V_{BR}$, where $V_{BR}=V_{D1}+V_{D3}$, $V_{D1}$ denotes a forward voltage drop of the first diode D1 that is about 0.6 to 0.7V at room temperature, and $V_{D3}$ denotes a reverse breakdown withstand voltage of the zener diode D3. Voltage values in different application ranges can be acquired by controlling the doping concentrations of the zener diode active region 139 and the fifth doped region 161. For a TVS product applied under a working voltage (VDD) of 5V, $V_{D3}$ is generally limited between 5 and 8V. Therefore, the voltage at the input/output terminal I/O is clamped in a safe voltage range, which has a very good protection effect. When a negative instant impulse signal is input through the input/output terminal I/O, since the second diode D2 is forwardly biased and the first diode D1 is reversely biased, the signal flows first through the diode D2, and lastly flows to the ground GND.

In the embodiment shown in FIG. 1, the second-conductivity-type well region further includes a fifth well 136, and the first well 122 is disposed between the third well 132 and the fifth well 136.

In an embodiment, the junction depth of the first-conductivity-type well region and the second-conductivity-type well region is from 7 micrometers to 15 micrometers.

In the embodiment shown in FIG. 1, the first-conductivity-type well region (that is, the first well 122 and the second well 124) is a deep N-well (DN), and the second-conductivity-type well region (that is, the third well 132, the fourth well 134, and the fifth well 136) is a deep P-well (DP). Since the well region is the deep well, when a voltage is applied at electrodes of the device, the spreading width of the depletion layer will be larger (larger than the spreading width of the depletion layer of a well having a smaller junction depth in the conventional transient-voltage suppression device), which is equivalent to making the distance between the electrode plates larger. Therefore, the parasitic capacitance decreases. Further, in an embodiment, since the first-conductivity-type well region and the second-conductivity-type well region are formed by drive-in a long time at high temperatures, the doping concentration is less than that of the well region of the conventional transient-voltage suppression device, which is advantageous to further decrease the parasitic capacitance.

In the embodiment shown in FIG. 1, in the first well 122 are disposed two second doped regions 142 serving as the anode region of the second diode D2, in the second well 124 are disposed two third doped regions 151 serving as the cathode region of the first diode D1, and in the fourth well 134 are disposed two sixth doped regions 162 serving as the anode region of the zener diode D3.

In an embodiment, an isolation structure can be disposed between the structures in the active region, which need to be isolated from each other. In the embodiment shown in FIG. 1, an isolation structure 170 is disposed between the first doped region 141 and the second doped region 142 for isolation, and an isolation structure 170 is disposed between the third doped region 151 and the fourth doped region 152. The two closest doped regions of the first well 122 and the second region 124 are isolated from each other by the isolation structure 170. That is, the isolation structure 170 is disposed between the second doped region 142 (the right second doped region 142 in FIG. 1) and the third doped region 151 (the left third doped region 151 in FIG. 1) for isolation. The two closest doped regions of the second well 124 and the fourth region 134 are isolated from each other by the isolation structure 170. That is, the isolation structure 170 is disposed between the third doped region 151 (the right third doped region 151 in FIG. 1) and the sixth doped region 162 (the left third doped region 162 in FIG. 1) for isolation.

In an embodiment, the isolation structure is made of an oxide insulating material, for example, oxide silicon. In an embodiment, the isolation structure 170 is a LOCOS (local-oxidation-of-silicon) structure.

In the embodiments shown in FIG. 1, the isolation structures 170 are disposed on the surface of the substrate 110 except the doped regions and the zener diode active region 139.

In an embodiment, the second-conductivity-type well region is formed on the areas of the surface of the substrate 110 except the surface for the first-conductivity-type well region.

Figure 3:
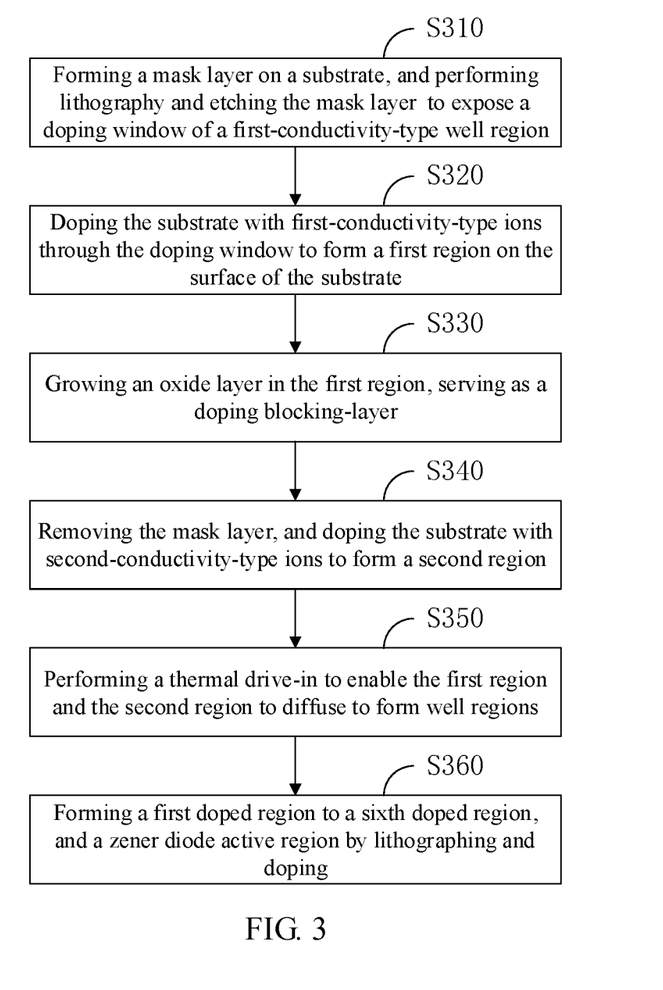
FIG. 3 is a flow chart of a method for manufacturing a transient-voltage suppression device according to an embodiment.

FIG. 3 is a flow chart of a method for manufacturing a transient-voltage suppression device according to an embodiment. The method includes following steps.

At step S310, forming a mask layer on a substrate, and performing lithography and etching the mask layer to expose a doping window of a first-conductivity-type well region.

After the mask layer is formed on the substrate, a surface of the mask layer is coated with a photoresist. Then, the photoresist is exposed and developed to form a pattern of the doping window of the first-conductivity-type well region. Next, the mask layer not covered by the photoresist is etched off to expose the doping window of the first-conductivity-type well region. In the embodiment shown in FIG. 1, the mask layer is a hard mask 182. In an embodiment, the hard mask 182 can be a silicon nitride layer. In the embodiment shown in FIG. 1, before the hard mask 182 is formed, a sacrificial oxide layer 171 is formed on the surface of the substrate 110. It also needs to remove the sacrificial oxide layer 171 at corresponding areas when etching. In an embodiment, the hard mask 182 can be formed by depositing silicon nitride, and the sacrificial oxide layer 171 can be formed by thermally growing an oxide layer.

In an embodiment, the substrate 110 is a semiconductor substrate. The material of the substrate 110 can be undoped monocrystalline silicon, monocrystalline silicon doped with impurities, silicon on insulator (SOI), stacked-silicon on insulator (SSOI), stacked-silicon-germanium on insulator (S—SiGeOI), silicon germanium on insulator (SiGeOI), germanium on insulator (GeOI), and the like.

At step S320, doping the substrate with first-conductivity-type ions through the doping window to form a first region on the surface of the substrate.

Figure 4A:
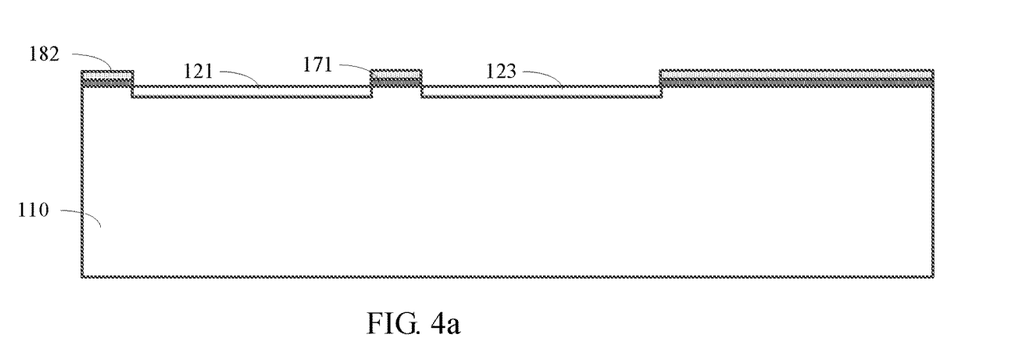
FIGS. 4a to 4c are schematic sectional views of the transient-voltage suppression device manufactured by the method of FIG. 3 during a manufacturing process.

In this embodiment, the first region (including a region 121 and a region 123) is formed on the surface of the substrate by an ion-implantation process to implant ions of N-type impurities, as shown in FIG. 4a.

At step S330, growing an oxide layer in the first region, serving as a doping blocking-layer.

In this embodiment, the oxide layer grows on the surface of the substrate 110 after the photoresist is removed. Since the regions excluding the doping window of the first-conductivity-type well region are covered by the mask layer (which is hardly to be oxidized), the doping blocking-layer can only be formed in the doping window of the first-conductivity-type well region.

At step S340, removing the mask layer, and doping the substrate with second-conductivity-type ions to form a second region.

Figure 4B:
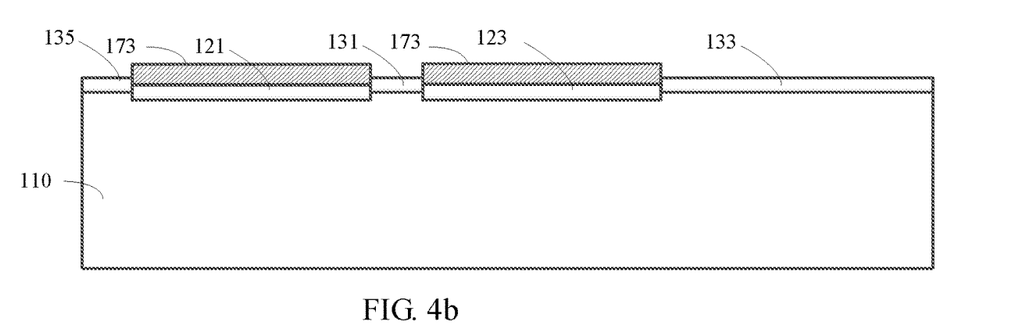

In this embodiment, ions of P-type impurities are implanted by an ion-implantation process after the mask layer is removed. Referring to FIG. 4b, since the doping blocking-layer 173 is formed at the doping window of the first-conductivity-type well region, the second region (including a region 131, a region 133, and a region 135) can only be formed on the areas except the first region. It can be understood that, in other embodiments, the first region can also be formed by implanting P-type ions, and the second region can be formed correspondingly by implanting N-type ions.

At step S350, performing a thermal drive-in to enable the first region and the second region to diffuse to form well regions.

Figure 4C:
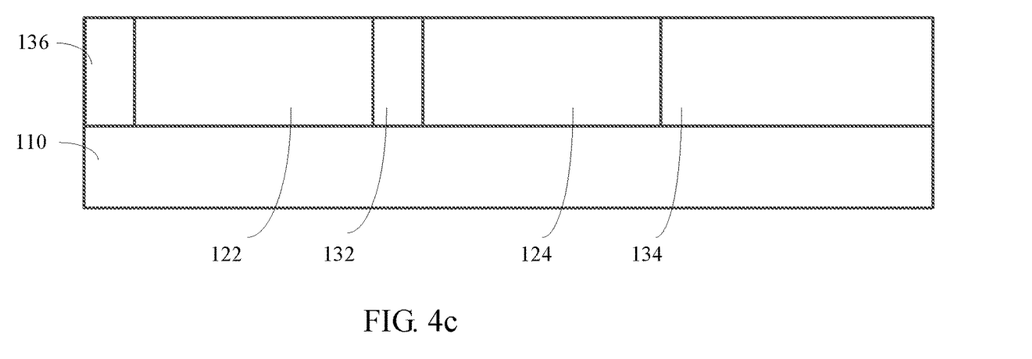

In this embodiment, by performing drive-in at high temperatures, the region 121 diffuses to form a first well 122, the region 123 diffuses to form a second well 124, the region 131 diffuses to form a third well 132, the region 133 diffuses to form a fourth well 134, and the region 135 diffuses to form a fifth well 136, as shown in FIG. 4c.

In an embodiment, the temperature of the thermal drive-in is 1000 to 1300 degree Celsius, and the lasting time is 250 to 350 minutes. Due to the high temperature and the long-lasting time, the obtained well regions have deeper depths and lower concentrations. Since the wide broadening of the depletion layer, when a voltage is applied to the electrodes of the device, becomes larger, which is equivalent to increasing the distance between the electrode plates, the parasitic capacitance decreases. In an embodiment, an amount of the ion-implantation at step S340 is slightly larger than an amount of the ion-implantation at step S320. Further, the amount of the ion-implantation at step S320 and step S340 is 5E11 $cm^{-2}$ to 5E12 $cm^{-2}$.

At step S360, forming a first doped region to a sixth doped region, and a zener diode active region by lithographing and doping.

A first doped region 141, a second doped region 142, a third doped region 151, a fourth doped region 152, a fifth doped region 161, a sixth doped region 162, and a zener diode active region 139 are respectively formed by lithographing and doping after the doping blocking-layer 173 is removed (the doping blocking-layer 173 is removed before the thermal drive-in in this embodiment). In this embodiment, the first doped region 141, the third doped region 151, the fifth doped region 161 are N-type doped regions, and the second doped region 141, the fourth doped region 152, the sixth doped region 162 are P-type doped regions. The zener diode active region 139 is of P-type. In this embodiment, the N-type doped regions are formed first, then the P-type doped regions are formed, and then the zener diode active region 139 is formed.

In an embodiment, a step forming the isolation structure is further included between step S350 and step S360. Specifically, the isolation structure 170 can be formed by a LOCOS process after lithographing, as shown in FIG. 1.

In an embodiment, the photoresist is removed after the isolation structures 170 are formed. Then, a first implantation photomask is used for lithographing to expose the areas in which the N-type doped regions are to be formed by implantation. The N-type ions are implanted to form the N-type doped regions. Next, the photoresist is removed. Then, a second implantation photomask is used for lithographing to expose the areas in which the P-type doped regions are to be formed by implantation. The P-type ions are implanted to form the P-type doped regions. The photoresist is in turn removed. A third implantation photomask is used for lithographing to implant the P-type ions to form the zener diode active region. Referring to FIG. 1, the zener diode active region 139 is formed in the fourth well 134. The first doped region 141 is formed in the first well 122. The second doped region 142 is formed in the first well 122. The third doped region 151 is formed in the second well 124. The fourth doped region 152 is formed in the second well 124. The fifth doped region 161 is formed in the zener diode active region 139. The sixth doped region 162 is formed in the zener diode active region 139.

In an embodiment, after step S360, the method further includes following steps.

A dielectric layer is formed. Specifically, an interlayer dielectric (ILD) can be formed by using a deposition process.

A contact via is formed, and a conductive material is filled into the contact via. Specifically, the contact via can be formed by etching the dielectric layer after lithographing. The conductive material can be any suitable conductive material well known to those skilled in the art, including but not limited to metal. The metal can include one or more of Ag, Au, Cu, Pd, Pt, Cr, Mo, Ti, Ta, W and Al. In an embodiment, the dielectric layer is etched by a dry-etching process.

Metal interconnecting-wires are formed on the dielectric layer. Specifically, the metal layer can be lithographed and etched after the deposition of the metal layer to form the metal interconnecting-wires. In an embodiment, the deposited metal layer has a thickness of 3 micrometers. In an embodiment, the metal layer is etched by a dry-etching process.

In an embodiment, after the metal interconnecting-wires are formed, the method further includes a step of forming a passivation layer and a step of lithographing and etching the passivation layer to form a metal electrode contact.

In an embodiment, the interlayer dielectric can be an oxide silicon layer, including a doped or undoped material layer of oxide silicon, which is formed by a thermal chemical vapor deposition (thermal CVD) process or a high-density plasma process, for example, undoped silicon glass, phosphosilicate glass (PSG) or borophosphosilicate glass (BPSG). In addition, the interlayer dielectric can also be spin-on glass (SOG) doped with boron or doped with phosphorus, tetraethoxysilane (PTEOS) doped with phosphorus, or tetraethoxysilane (PTEOS) doped with boron.

In an embodiment, the deposited interlayer dielectric can also be planarized by a planarization method (for example, chemical mechanical polishing (CMP)), so that the interlayer dielectric has a planar surface.

According to the above-mentioned method for manufacturing the transient-voltage suppression device, the isolation of the first well from the second well by the third well is equivalent to the isolation of the first diode from the second diode, which has a good isolation effect, thereby avoiding the switch-on of the parasitic BJT. Therefore, the ESD has a strong robustness and is easily to be integrated. Moreover, the N-wells and the P-wells are formed in the same drive-in at step S350, which can decrease the size of the wide broadening, thereby significantly decreasing the area of the integrated TVS chip and effectively reducing the manufacturing costs.

In an embodiment, at step S360 of forming the zener diode active region 139, phosphorus ions and boron ions are implanted, and the implantation concentration of the boron ions is greater than the implantation concentration of the phosphorus ions.

In an embodiment, the zener diode active region 139 is formed by implanting phosphorus ions of 1E14 $cm^{-2}$ with the implanting energy of 160 keV, and implanting boron ions of 3.8E14 $cm^{-2}$ with the implanting energy of 180 keV. Since the zener diode D3 is a diode that needs to carry a large current, a plurality of zener diodes D3 will be generally connected in parallel on the layout, thereby resulting a large area of the layout. However, when the breakdown point of the zener diode is close to the surface of the substrate, the break down is unstable due to the fluctuation of processes, and it is easily to cause the device to be burned unexpected. In this embodiment, an implantation of phosphorus ions having a high concentration is introduced. Since phosphorus has a smaller mass than arsenic, phosphorus ions are implanted deeper, and the thermal diffusion is faster than that of arsenic, so the breakdown point can be clamped deeper in the substrate, thereby increasing the reliability (robustness) of the device.

In an embodiment, at step S320, arsenic ions of 5E15 $cm^{-2}$ and phosphorus ions of 1E14 $cm^{-2}$ are implanted.

In an embodiment, at step S340, boron difluoride of 2.5E15 $cm^{-2}$ is implanted.

In an embodiment, the doping blocking-layer 173 is removed by a wet-etching process.

In an embodiment, the method for manufacturing the transient-voltage suppression device includes seven lithographing processes: the lithographing at step 310, the lithographing for forming the isolation structures 170, the lithographing to form the N-type doped regions using the first implantation photomask, the lithographing to form the P-type doped regions using the second implantation photomask, the lithographing to form the zener diode active region using the third implantation photomask, the lithographing to form the contact via, and the lithographing to form the metal interconnecting-wires.

The above-mentioned embodiments only express a few implementations of the present disclosure, and the description is comparably specific and detailed, but it should not be interpreted as a limitation on the scope of the present disclosure. It should be pointed out that for those of ordinary skill in the art, without departing from the concept of the present disclosure, several modifications and improvements can be made, and these all fall within the protection scope of the present disclosure. Therefore, the protection scope of the disclosure should be subject to the appended claims.

What is claimed is:

1. A transient-voltage suppression device, comprising:
   a substrate of a second conductivity type;
   a first-conductivity-type well region disposed in the substrate and including a first well and a second well;
   a second-conductivity-type well region disposed in the substrate and including a third well and a fourth well, the third well being disposed between the first well and the second well to isolate the first well and the second well from each other, and the second well being disposed between the third well and the fourth well; the first conductivity type and the second conductivity type being conductivity types opposite to each other;
   a zener diode active region disposed in the fourth well and being of the second conductivity type;
   a first doped region being of the first conductivity type and disposed in the first well;
   a second doped region being of the second conductivity type and disposed in the first well;
   a third doped region being of the first conductivity type and disposed in the second well;
   a fourth doped region being of the second conductivity type and disposed in the second well;
   a fifth doped region being of the first conductivity type and disposed in the zener diode active region; and
   a sixth doped region being of the second conductivity type and disposed in the zener diode active region;
   wherein the fourth doped region is used as an anode region of a first diode, the first doped region is used as a cathode region of a second diode, and an electrical connection between the first doped region and the fourth doped region is used as a first potential terminal; the third doped region is used as a cathode region of the first diode, the fifth doped region is used as a cathode region of a zener diode, and an electrical connection between the third doped region and the fifth doped region is used as a second potential terminal; and the second doped region is used as an anode region of the second diode, the sixth doped region is used as an anode region of the zener diode, and an electrical connection between the second doped region and the sixth doped region is used as a third potential terminal;
   isolation of the first well from the second well by the third well is equivalent to isolation of the first diode from the second diode;
   the Zener diode active region has a doping concentration different than that of the fourth well;
   wherein the Zener diode active region has phosphorus doping ions and boron doping ions, and a doping concentration of the phosphorus doping ions is less than that of the boron doping ions;
   wherein the first well and the second well are deep N-wells; the third well, the fourth well, and the fifth well are deep P-wells; and the first-conductivity-type well region and the second-conductivity-type well region are formed by drive-in a long time of 250 to 350 minutes at high temperatures of 1000 to 1300 degree Celsius.

2. The transient-voltage suppression device of claim 1, wherein the first potential terminal is adapted to be electrically connected to an input/output terminal, the second potential terminal is adapted to be electrically connected to a working-voltage terminal, and the third potential terminal is adapted to be connected to ground.

3. The transient-voltage suppression device of claim 1, wherein the first-conductivity-type well region and a second-conductivity-type well region have a junction depth in a range of 7 micrometers to 15 micrometers.

4. The transient-voltage suppression device of claim 1, wherein the first conductivity type is N-type, and the second conductivity type is P-type.

5. The transient-voltage suppression device of claim 1, wherein the second-conductivity-type well region further comprises a fifth well, and the first well is disposed between the third well and the fifth well.

6. The transient-voltage suppression device of claim 1, wherein two second doped regions are disposed in the first well, two third doped regions are disposed in the second well, and two sixth doped regions are disposed in the fourth well.

7. The transient-voltage suppression device of claim 1, wherein the transient-voltage suppression device further comprises:
   a first isolation structure disposed between the first doped region and the second doped region and isolating the first doped region and the second doped region from each other;
   a second isolation structure disposed between the third doped region and the fourth doped region and isolating the third doped region and the fourth doped region;
   a third isolation structure disposed between two closest doped regions in the first well region and the second well region and isolating the two doped regions from each other; and
   a fourth isolation structure disposed between two closest doped regions in the second well region and the fourth well region and isolating the two doped regions from each other.

8. The transient-voltage suppression device of claim 7, wherein the first through fourth isolation structures are made of an oxide insulating material.

9. A method for manufacturing a transient-voltage suppression device, the transient-voltage suppression device including a first diode, a second diode, and a zener diode, an electrical connection between an anode of the first diode and a cathode of the second diode being used as a first potential terminal, an electrical connection between a cathode of the first diode and a cathode of the zener diode being used as a second potential terminal, and an electrical connection between an anode of the second diode and an anode of the zener diode being used as a third potential terminal, wherein the method comprises:
forming a mask layer on a substrate of a second conductivity type, and then performing lithography and etching the mask layer to expose a doping window of a first-conductivity-type well region;
doping the substrate with first-conductivity-type ions through the doping window of the first-conductivity-type well region to form a first region on a surface of the substrate;
growing an oxide layer as a doping blocking-layer in the first region;
removing the mask layer, and doping areas of the surface of the substrate not covered by the doping blocking-layer with second-conductivity-type ions to form a second region, a first conductivity type and the second conductivity type being conductivity types opposite to each other;
performing a thermal drive-in to enable the first region to diffuse to form a first well and a second well, and enable the second region to diffuse to form a third well and a fourth well, the third well being located between the first well and the second well to isolate the first well and the second well from each other, the second well being located between the third well and the fourth well; and
forming, after the doping blocking-layer is removed, respectively a first doped region, a second doped region, a third doped region, a fourth doped region, a fifth doped region, a sixth doped region, and a zener diode active region by lithographing and doping;
wherein the zener diode active region is located in the fourth well and is of the second conductivity type; the first doped region is of the first conductivity type and is located in the first well; the second doped region is of the second conductivity type and is disposed in the first well;
the third doped region is of the first conductivity type and is disposed in the second well; the fourth doped region is of the second conductivity type and is disposed in the second well; the fifth doped region is of the first conductivity type and is disposed in the zener diode active region; and the sixth doped region is of the second conductivity type and is disposed in the zener diode active region; and
wherein the Zener diode active region has a doping concentration different than that of the fourth well;
wherein the Zener diode active region has phosphorus doping ions and boron doping ions, and a doping concentration of the phosphorus doping ions is less than that of the boron doping ions;
wherein the first well and the second well are deep N-wells; the third well, the fourth well, and the fifth well are deep P-wells; and the first-conductivity-type well region and the second-conductivity-type well region are formed by drive-in a long time of 250 to 350 minutes at high temperatures of 1000 to 1300 degree Celsius.

10. The method of claim 9, wherein the thermal drive-in has a temperature in a range of 1000 to 1300 degree Celsius, and a lasting time in a range of 250 minutes to 350 minutes.

11. The method of claim 9, wherein the forming the mask layer on the substrate of the second conductivity type is forming a silicon nitride layer by deposition.

12. The method of claim 9, wherein the first conductivity type is N-type, and the second conductivity type is P-type; the step of forming respectively the first doped region, the second doped region, the third doped region, the fourth doped region, the fifth doped region, the sixth doped region, and the zener diode active region by lithographing and doping, comprises:
forming the first doped region, the third doped region, and the fifth doped region by lithographing using a first implantation photomask, and ion-implantation;
forming the second doped region, the fourth doped region, and the sixth doped region by lithographing using a second implantation photomask, and ion-implantation; and
forming the zener diode active region by lithographing using a third implantation photomask, and ion-implantation, including implanting phosphorus ions and boron ions, the boron ions having an implantation concentration greater than an implantation concentration of the phosphorus ions.

13. The method for manufacturing the transient-voltage suppression device of claim 12, wherein the step of forming the zener diode active region is implanting the phosphorus ions of $1E14$ $cm^{-2}$ with an implantation energy of 1.60 keV, and implanting the boron ions of $3.8E14$ $cm^{-2}$ with an implantation energy of 180 keV.

14. The method of claim 9, wherein after the step of removing the doping blocking-layer and prior to the step of forming respectively the first doped region, the second doped region, the third doped region, the fourth doped region, the fifth doped region, the sixth doped region, and the zener diode active region by lithographing and doping, the method further comprises a step of forming isolation structures, Wherein the isolation structures are adapted to isolate the first doped region and the second doped region from each other, to isolate the third doped region and the fourth doped region from each other, to isolate two closest doped regions in the first well and the second well region from each other, and to isolate two closest doped regions in the second well region and the fourth well region from each other.

15. The method of claim 9, wherein after the step of forming respectively the first doped region, the second doped region, the third doped region, the fourth doped region, the fifth doped region, the sixth doped region, and the zener diode active region, the method further comprises:
forming a dielectric layer;
forming a contact via, and filling a conductive material into the contact via; and
forming metal interconnecting-wires on the dielectric layer, using the electrical connection between the anode of the first diode and the cathode of the second diode as the first potential terminal, using the electrical connection between the cathode of the first diode and the cathode of the zener diode as the second potential terminal, and using the electrical connection between the anode of the second diode and the anode of the zener diode as the third potential terminal.

* * * * *